United States Patent
Antonyan et al.

(10) Patent No.: US 12,237,005 B2
(45) Date of Patent: Feb. 25, 2025

(54) NONVOLATILE MEMORY DEVICES THAT SUPPORT ENHANCED POWER SAVING DURING STANDBY MODES

(71) Applicant: Samsung Electronics Co., Ltd., Suwon-si (KR)

(72) Inventors: Artur Antonyan, Seoul (KR); Ji Eun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 323 days.

(21) Appl. No.: 18/059,574

(22) Filed: Nov. 29, 2022

(65) Prior Publication Data

US 2023/0170014 A1    Jun. 1, 2023

(30) Foreign Application Priority Data

Nov. 30, 2021    (KR) ........................ 10-2021-0168727

(51) Int. Cl.
G11C 11/408    (2006.01)
G11C 11/4091   (2006.01)
G11C 11/4096   (2006.01)

(52) U.S. Cl.
CPC ...... *G11C 11/4096* (2013.01); *G11C 11/4087* (2013.01); *G11C 11/4091* (2013.01)

(58) Field of Classification Search
CPC ............ G11C 11/4096; G11C 11/4087; G11C 11/4091
USPC .................................................. 365/189.011
See application file for complete search history.

(56) References Cited

U.S. PATENT DOCUMENTS

| | | | |
|---|---|---|---|
| 7,298,664 B2 | 11/2007 | Lee | |
| 7,397,721 B2 | 7/2008 | Lee | |
| 7,532,535 B2 | 5/2009 | Jeong | |
| 7,577,858 B2 | 8/2009 | Garg et al. | |
| 9,336,882 B2 | 5/2016 | Katayama et al. | |
| 10,803,961 B2 | 10/2020 | Kitani | |
| 11,087,833 B2 | 8/2021 | Kuo et al. | |
| 2003/0067318 A1* | 4/2003 | Takahashi | G01R 31/31721 324/762.02 |
| 2004/0080340 A1* | 4/2004 | Hidaka | H03K 19/0016 326/83 |

(Continued)

FOREIGN PATENT DOCUMENTS

CN    209747133 U  *  12/2019 ......... G11C 11/4074

*Primary Examiner* — Ly D Pham
(74) *Attorney, Agent, or Firm* — Myers Bigel, P.A.

(57) ABSTRACT

A nonvolatile memory device includes a memory cell array having nonvolatile memory cells therein, which are electrically connected to a plurality of word lines and a plurality of bit lines. A write driver and row decoder are provided, which are electrically connected to the plurality of bit lines and the plurality of word lines, respectively. Control logic is configured to transfer a first voltage to the write driver and a second voltage to the row decoder. The control logic includes: (i) a normal standby mode circuit configured to operate in a normal standby mode, and (ii) a deep standby mode circuit configured to operate in a deep standby mode. To save power, the layout areas of a plurality of elements within the deep standby mode circuit are smaller than layout areas of elements within the normal standby mode circuit, so that current flowing within the deep standby mode circuit during the deep standby mode is less than current flowing within the normal standby mode circuit during the normal standby mode.

20 Claims, 13 Drawing Sheets

(56) References Cited

U.S. PATENT DOCUMENTS

| | | | |
|---|---|---|---|
| 2005/0276110 A1* | 12/2005 | Sakurai | G11C 5/147 |
| | | | 365/185.18 |
| 2010/0302877 A1* | 12/2010 | Bang | G11C 5/147 |
| | | | 365/230.03 |
| 2021/0216224 A1 | 7/2021 | Kim | |

* cited by examiner

P_0a

NONVOLATILE MEMORY DEVICES THAT SUPPORT ENHANCED POWER SAVING DURING STANDBY MODES

REFERENCE TO PRIORITY APPLICATION

This application claims priority to Korean Patent Application No. 10-2021-0168727, filed Nov. 30, 2021, the disclosure of which is hereby incorporated herein by reference.

FIELD OF THE INVENTION

The present disclosure relates to integrated circuit devices and, more particularly, to nonvolatile memory devices.

BACKGROUND

Nonvolatile memory devices that use resistance materials to store data may include phase change memory device (PRAM: Phase change Random Access Memory), a resistive memory device (RRAM: Resistive RAM), a magnetic memory device (MRAM: Magnetic RAM), and the like. A dynamic random access memory device (DRAM) and a flash memory device store data using electrical charges, whereas nonvolatile memory devices that use resistance materials typically store data using a status change (PRAM) of a phase-change material such as chalcogenide alloy, a resistance change (RRAM) of a variable resistance material, a resistance change (MRAM) of a MTJ (Magnetic Tunnel Junction) thin film according to a magnetization status of a ferromagnetic material, and the like.

More specifically, magnetic random access memory (MRAM) has received increased attention because it supports relatively rapid reading/writing speeds, high durability, non-volatility, and low power consumption during operation. Further, the MRAM may store information using a magnetic material as an information-storage medium. However, power-wasting standby currents can leak when the MRAM is disposed into a standby mode of operation. Accordingly, there is a need to reduce power consumption within MRAM and other nonvolatile memory devices by reducing standby leakage currents.

SUMMARY

Aspects of the present disclosure provide a nonvolatile memory device having reduced susceptibility to power-wasting leakage currents, by using control logic that contains a power-saving deep standby mode circuit, which operates in a deep standby mode that requires less standby current compared to a conventional standby mode.

According to some aspects of the present disclosure, a nonvolatile memory device is provided having a nonvolatile memory cell array therein that is connected to a plurality of word lines and a plurality of bit lines. A write driver is provided, which is connected to the plurality of bit lines, and a row decoder is provided, which is connected to the plurality of word lines. Control logic is provided, which is configured to transfer a first voltage to the write driver and a second voltage to the row decoder. The control logic includes a normal standby mode circuit, which is configured to operate in a normal standby mode, and a deep standby mode circuit, which is configured to operate in a deep standby mode. Advantageously, to reduce power consumption, the layout areas of a plurality of elements within the deep standby mode circuit are smaller than layout areas of corresponding elements within a normal standby mode circuit, so that currents flowing through a deep standby mode circuit are smaller than currents flowing through a normal standby mode circuit.

According to some additional aspects of the present disclosure, there is a provided a nonvolatile memory device including a normal standby mode circuit, which is turned on by a normal standby mode enable signal, and a deep standby mode circuit, which is turned on by a deep standby mode enable signal. The layout areas of a plurality of elements within the deep standby mode circuit are smaller than corresponding layout areas of elements within the normal standby mode circuit, such that currents flowing within the deep standby mode circuit are smaller than currents flowing through the normal standby mode circuit, and when: (i) a deep standby mode enable signal is turned on at a first time point and a deep standby mode circuit is turned on at a second time point delayed relative to the first time point, and (ii) a normal standby mode enable signal maintains a turned-on status from the first time point to the second time point.

According to further aspects of the present disclosure, a nonvolatile memory device is provided, which includes a memory cell having one terminal connected to a bit line (to which data is transmitted) and another terminal connected to a word line (to which a turn-on voltage is transmitted). A first transistor, which is provided within a write driver, is connected to a bit line and is configured to transmit a first voltage. A second transistor is provided, which is configured to transmit a second voltage to a row decoder connected to a word line. The second transistor is electrically connected in series with the first transistor. A first resistor is provided, which is connected in series with the first transistor and the second transistor. A normal standby mode circuit and a deep standby mode circuit are provided, which control a first voltage and a second voltage. The normal standby mode circuit operates in a normal standby mode, and the deep standby mode circuit operates in a deep standby mode. Advantageously, to reduce power consumption caused by leakage currents, the layout areas of a plurality of elements within the deep standby mode circuit are smaller than the layout areas of corresponding elements within a normal standby mode circuit, such that currents flowing within the deep standby mode circuit are smaller than currents flowing through the normal standby mode circuit.

Aspects of the present disclosure are not restricted to the ones explicitly set forth herein. In addition, the above and other aspects of the present disclosure will become more apparent to one of ordinary skill in the art to which the present disclosure pertains by referencing the detailed description of the present disclosure given below.

DETAILED DESCRIPTION OF THE EMBODIMENTS

Figure 1:
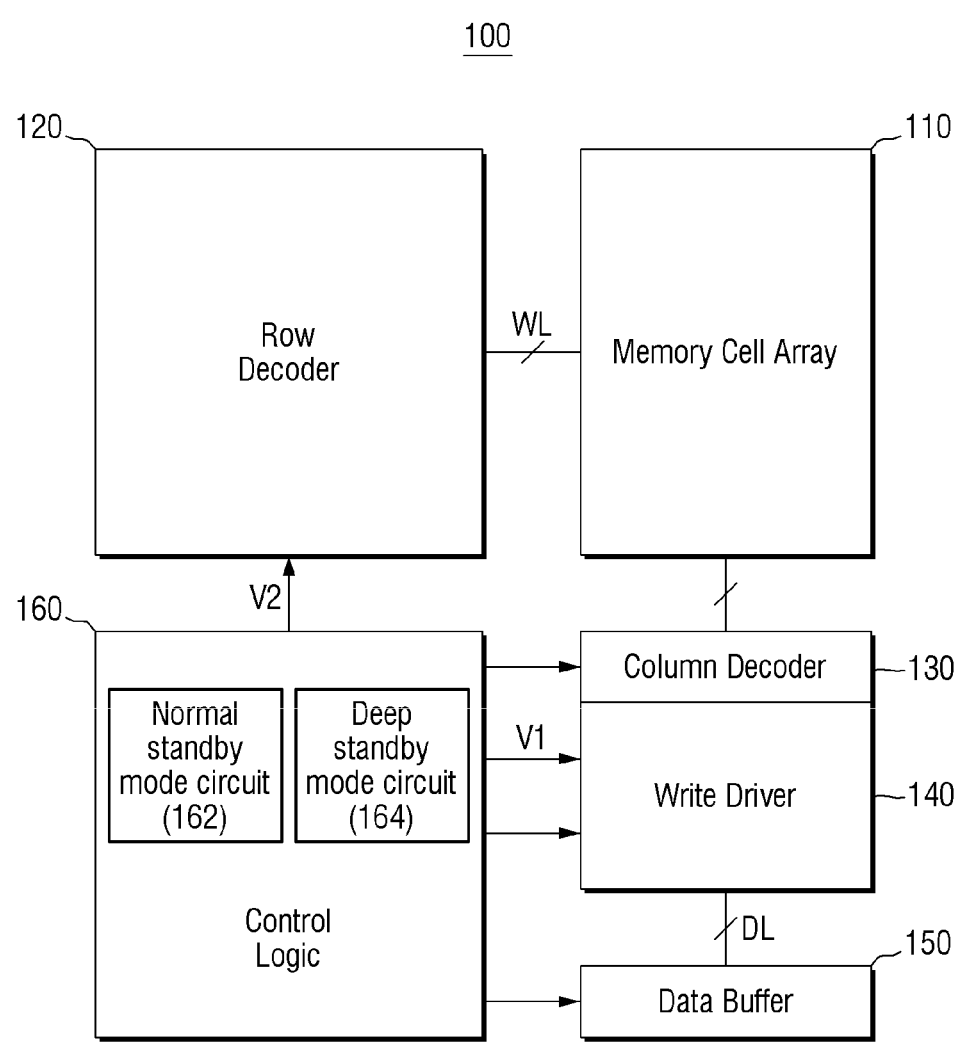
FIG. 1 is a block diagram illustrating a nonvolatile memory device according to some embodiments.
Figure 2:
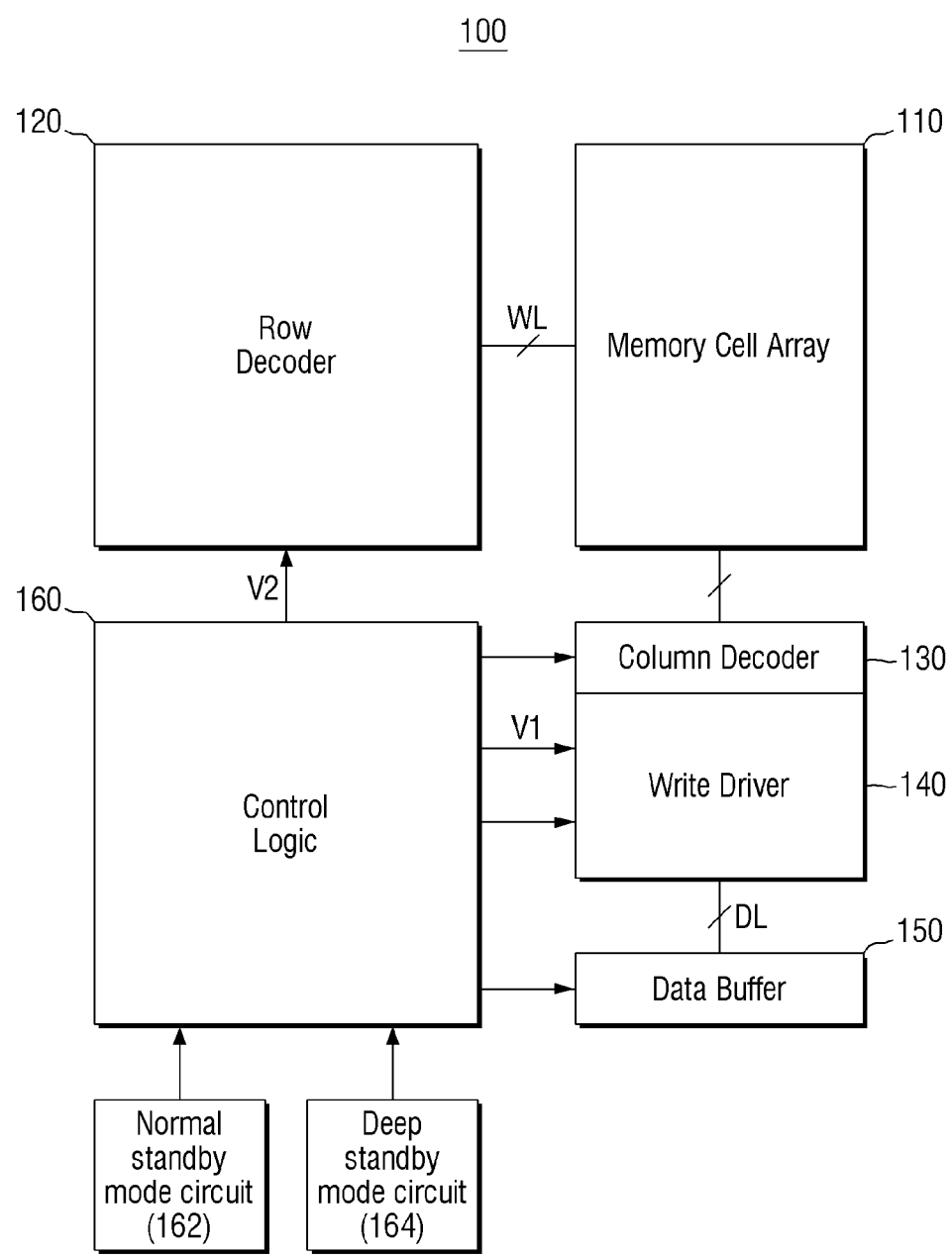
FIG. 2 is a block diagram illustrating another nonvolatile memory device according to some embodiments.

FIG. 1 is a block diagram that illustrates a nonvolatile memory device according to some embodiments, and FIG. 2 is a block diagram that illustrates another nonvolatile memory device according to some embodiments. Referring to FIG. 1, a nonvolatile memory device 100 according to some embodiments includes a memory cell array 110, a row decoder 120, a column decoder 130, a write driver 140, a data buffer 150, and control logic 160. As shown, the control logic 160 may include a normal standby mode circuit 162 and a deep standby mode circuit 164. Referring now to FIG. 2, the nonvolatile memory device 100 according to another embodiment includes a normal standby mode circuit 162 and/or a deep standby mode circuit 164, which extend outside the control logic 160. Hereinafter, the description will be made on the assumption that the normal standby mode circuit 162 and the deep standby mode circuit 164 are included inside the control logic 160 of the nonvolatile memory device 100 according to some embodiments.

Referring again to FIG. 1, the row decoder 120 may control the voltages of a plurality of word lines WL in accordance with the control of the control logic 160. For example, the row decoder 120 may apply a selective voltage for reading or writing to the selected word line, and may apply an unselective voltage (or voltages) for preventing the reading or writing to other unselected word lines.

The column decoder 130 may be connected to source lines and bit lines inside the memory cell array 110. The column decoder 130 may be connected to the write driver. In accordance with the control of the control logic 160, the column decoder 130 may electrically connect some selected source lines among the source lines and some selected bit lines among the bit lines to the write driver.

In accordance with the control of the control logic 160, the column decoder 130 may apply bias voltages to the unselected remaining source lines among the source lines and the unselected remaining bit lines among the bit lines. The bias voltages may be defined not to affect the write operation or the read operation on the selected memory cells connected to the selected word line, some selected bit lines, and some selected source lines, and may include, for example, a ground voltage.

The data buffer 150 may be connected to the write driver 140 through the data lines DL. The data buffer 150 may exchange data with an external device (for example, a storage controller) in accordance with the control of the control logic 160. For example, at the time of the write operation, the data buffer 150 may transmit the data, which is received from the external device, to the write driver 140. At the time of the read operation, the data buffer 150 may output the data transmitted from sense amplifiers (not shown) in the write driver 140 to the external device.

The control logic 160 may receive a control signal and address from an external device (e.g., a storage controller). In response to the control signal and address received from an external device (e.g., a storage controller), the control logic may control the row decoder 120, the column decoder 130, the write driver 140, and the data buffer 150 to perform the write operation or the read operation.

The control logic 160 may provide a write active signal and an inverting write active signal to the write driver 140. The write active signal and the inverting write active signal may be, but are not limited to, complementary signals. When performing the write operation, the control logic 160 may control the write active signal to a high level, and control the inverting write active signal to a low level.

When the nonvolatile memory device 100 is in an active mode, peripheral circuits (e.g., the row decoder 120, the column decoder 130 or the write driver 140) may operate to perform an operation of storing data in the memory cells inside the memory cell array 110 or outputting the data stored in the memory cell to the outside. However, when the nonvolatile memory device 100 is in a normal standby mode, a standby status in which the read or write operation on the memory cell of the memory cell array 110 is not performed may be performed. When the nonvolatile memory device 100 enters the normal standby mode, peripheral circuits (e.g., the row decoder 120, the column decoder 130, or the write driver 140) are deactivated, and the power consumed by the peripheral circuits (e.g., the row decoder 120, the column decoder 130, or the write driver 140) may be reduced.

Furthermore, when the nonvolatile memory device 100 operates in the normal standby mode for a long time, in order to reduce the power consumption due to the leakage current in the nonvolatile memory device 100, a deep standby mode in which the operation of the peripheral circuits (for example, the row decoder 120, the column decoder 130, or the write driver 140) is completely stopped may be performed.

However, a leakage current may still occur even in the normal standby mode and the deep standby mode of the nonvolatile memory device 100, and the power may be consumed by the nonvolatile memory device 100. Therefore, the normal standby mode circuit 162 that operates in the normal standby mode and the deep standby mode circuit 164 that operates in the deep standby mode may be advantageously configured to minimize the leakage current generated in each mode.

For example, the normal standby mode circuit 162, which is configured as a circuit that receives an analog signal (for example, light, temperature, humidity, etc.) and switches it into an electric signal, may operate when the nonvolatile memory device 100 enters the normal standby mode. Furthermore, the deep standby mode circuit 164, which is configured as a circuit that receives an analog signal (for example, light, temperature, humidity, etc.) and switches it into an electric signal, has a circuit diagram that is equivalent to the normal standby mode circuit 162. However, the areas of the elements constituting the deep standby mode circuit 164 may be smaller (with less leakage) than those of the plurality of elements constituting the normal standby mode circuit 162.

That is, by making the circuits that operate in the normal standby mode and the deep standby mode different from each other, the leakage current generated in each mode may be minimized. More specifically, since the areas of the plurality of elements of the deep standby mode circuit 164 are smaller than the areas of the plurality of elements of the normal standby mode circuit 162, the leakage current flowing through the deep standby mode circuit 164 may become smaller.

This will be explained in detail through the normal standby mode circuit 162 and the deep standby mode circuit 164, which are schematically configured, through the circuit which receives an analog signal (for example, light, temperature, humidity, etc.) and switches it into an electric signal in FIGS. 3 and 4. The configuration of the circuit that receives the analog signal (e.g., light, temperature, or humidity, etc.) and switches it into an electrical signal is not limited to FIGS. 3 and 4.

Figure 3:
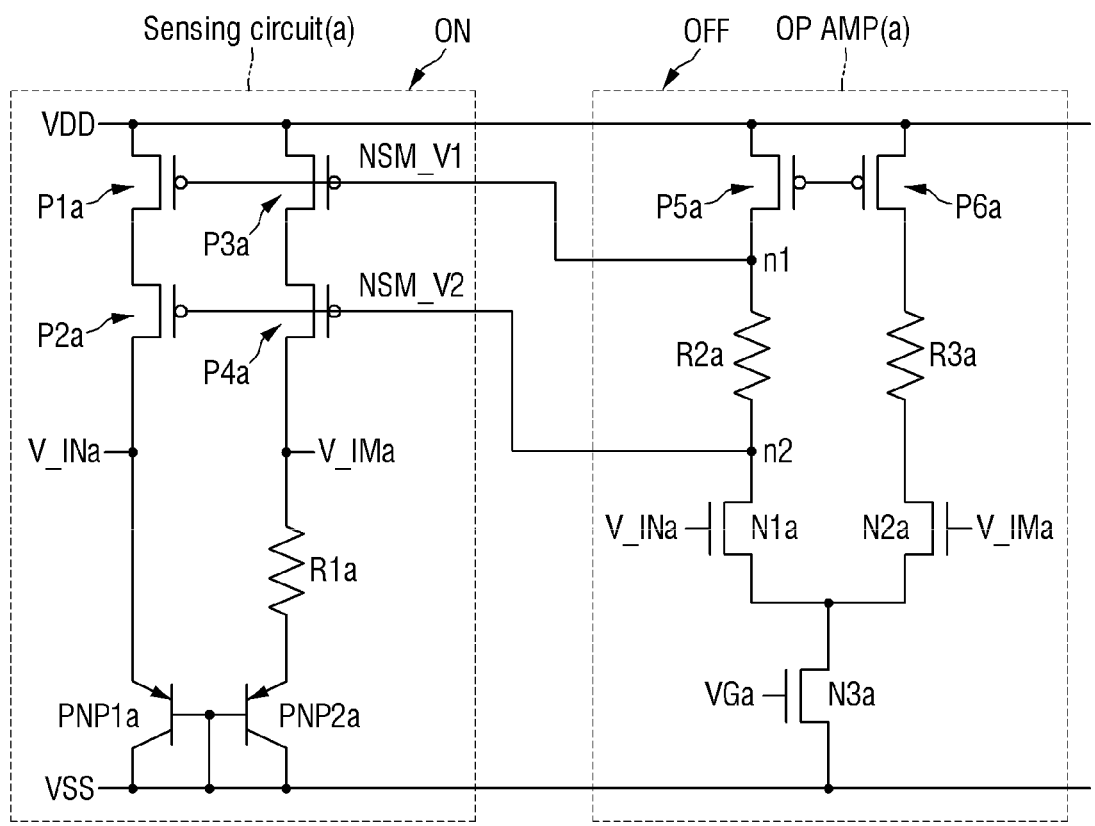
FIG. 3 is an exemplary circuit diagram for explaining a normal standby mode circuit which operates in a normal standby mode.
Figure 4:
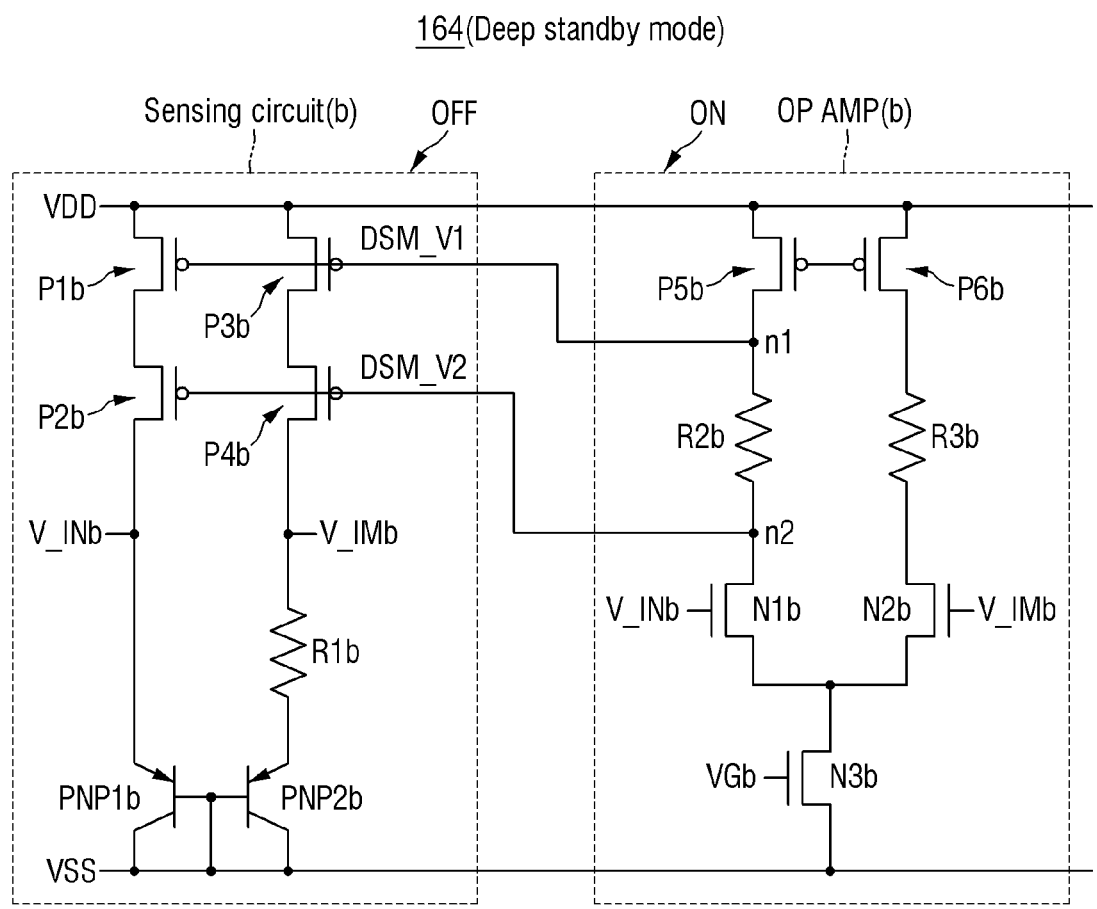
FIG. 4 is an exemplary circuit diagram for explaining a deep standby mode circuit which operates in a deep standby mode.

FIG. 3 is an exemplary circuit diagram for explaining a normal standby mode circuit which operates in a normal standby mode, whereas FIG. 4 is an exemplary circuit diagram for explaining a deep standby mode circuit which operates in a deep standby mode. Referring to FIG. 3, the normal standby mode circuit 162 that operates when the nonvolatile memory device is in the normal standby mode may include a sensing circuit (a) that senses an analog signal, and an OP AMP (a) that amplifies the analog signal.

The sensing circuit (a) of the normal standby mode circuit 162 includes transistors P1a and P3a that are connected to a power supply voltage VDD and gated by a first voltage NSM_V1. Further, the sensing circuit (a) includes a transistor P2a connected in series with the transistor P1a, and a transistor P4a connected in series with a transistor P3a. The transistor P2a and the transistor P4a may be gated by a second voltage NSM_V2. One end of each of the transistors P2a and P4a may receive analog signals V_INa and V_IMa, respectively. A resistor R1a may be connected to a node at which the transistor P4a receives the analog signal V_IMa.

The sensing circuit (a) may include bipolar junction transistors PNP1a and PNP2a connected to a ground voltage VSS. The base terminals of the bipolar junction transistors PNP1a and PNP2a are connected to each other and may be connected to the ground voltage VSS. The OP AMP (a) of the normal standby mode circuit 162 receives each of the analog signals V_INa and V_IMa, and may amplify the received analog signal into an electric signal. The OP AMP (a) includes transistors N1a and N2a that receive each of the analog signals V_INa and V_IMa.

One end of each of the transistors N1a and N2a are connected to each other, and may be connected to a transistor N3a connected to the ground voltage VSS. A first voltage NSM_V1 and a second voltage NSM_V2 may applied to each of both ends (first node n1 and second node n2) of a resistor R2a connected to the transistor N1a.

The OP AMP (a) may include transistors P5a and P6a which are connected to the power supply voltage VDD and have gates connected to each other. One end of the transistor P5a may be connected to the first node n1. Further, one end of the transistor P6a may be connected to the resistor R3a. The other end of the resistor R3a may be connected to the transistor N2a. At this time, when the nonvolatile memory device is in the normal standby mode, the sensing circuit (a) of the normal standby mode circuit 162 is turned on (ON) and the OP AMP (a) is turned off (OFF). That is, in the normal standby mode, only the sensing circuit (a) of the normal standby mode circuit 162 may operate.

Referring to FIGS. 3 and 4, the deep standby mode circuit 164 that operates when the nonvolatile memory device is in the deep standby mode may include a sensing circuit (b) that senses an analog signal, and an OP AMP (b) that amplifies the analog signal. Since the configurations of the circuit diagram of the deep standby mode circuit 164 and the circuit diagram of the normal standby mode circuit 162 are the same, differences will be mainly described. Advantageously, to reduce leakage currents during standby mode, the areas of the plurality of elements constituting the deep standby mode circuit 164 are smaller than the corresponding areas of the plurality of elements constituting the normal standby mode circuit 162.

For example, areas of transistors P1b, P2b, P3b, P4b, P5b, P6b, N1 b, N2b, N3b, PNP1b, and PNP2b that form the switching elements of the deep standby mode circuit 164 are smaller than areas of corresponding transistors P1 a, P2a, P3a, P4a, P5a, P6a, N1a, N2a, N3a, PNP1a, and PNP2a that form the normal standby mode circuit 162. Further, areas of resistors R1b, R2b, and R3b that form the deep standby mode circuit 164 are smaller than areas of resistors R1a, R2a, and R3a that form the normal standby mode circuit 162.

For example, the areas of the transistors P1b, P2b, P3b, P4b, P5b, P6b, N1 b, N2b, N3b, PNP1b, and PNP2b and the resistors R1b, R2b, and R3b that form the deep standby mode circuit 164 may be one-half (½) the areas of the transistors P1 a, P2a, P3a, P4a, P5a, P6a, N1a, N2a, N3a, PNP1a, and PNP2a and the resistors R1a, R2a, and R3a that form the normal standby mode circuit 162, however, size ratios other than one-half may also be utilized in other embodiments of the invention.

Based on these smaller dimensions, current flowing through the sensing circuit (b) of the deep standby mode circuit 164 is smaller than the current flowing through the sensing circuit (a) of the normal standby mode circuit 162 under otherwise equivalent circumstances. Further, the current flowing through the OP AMP (b) of the deep standby mode circuit 164 is smaller than the current flowing through the OP AMP (a) of the normal standby mode circuit 162.

For example, a case is assumed where the areas of the transistors P1b, P2b, P3b, P4b, P5b, P6b, N1 b, N2b, N3b, PNP1b, and PNP2b and the resistors R1b, R2b, and R3b that form the deep standby mode circuit 164 are one-half the areas of the transistors P1 a, P2a, P3a, P4a, P5a, P6a, N1a, N2a, N3a, PNP1a, and PNP2a and the resistors R1a, R2a, and R3a that form the normal standby mode circuit 162.

For example, assuming that the current flowing through the power supply voltage VDD of the sensing circuit (a) of the normal standby mode circuit 162 is 3 u, the current flowing through the power supply voltage VDD of the sensing circuit (b) of the deep standby mode circuit 164 may be 1.5 u. Further, assuming that the current flowing through the power supply voltage VDD of the OP AMP (a) of the normal standby mode circuit 162 is 1.5 u, the current flowing through the power supply voltage VDD of the OP AMP (b) of the deep standby mode circuit 164 may be 0.75 u.

Accordingly, when the nonvolatile memory device is in the deep standby mode, the sensing circuit (b) of the deep standby mode circuit 164 is turned off (OFF), and the OP AMP (b) is turned on (ON). That is, in the deep standby mode, only the OP AMP (b) of the deep standby mode circuit 164 may operate.

Therefore, the configurations of the normal standby mode circuit 162 and the deep standby mode circuit 164 are set to be the same, but the areas of each element are set to be different, and by operating the circuit that may minimize the power consumption according to the mode in which the nonvolatile memory device operates, it is possible to reduce the power consumption due to the leakage current of the nonvolatile memory device.

Referring to FIG. 1 again, the control logic 160 may generate gate voltages V1 and V2 at the time of the write operation. The gate voltages V1 and V2 may be transmitted to the write driver 140 and the row decoder 120. The first voltage V1 may be used by the write driver to generate a write voltage. Further, the second voltage V2 drives the word line driver and may be used by the row decoder 120 to select the word line. The gate voltages V1 and V2 may have a higher level than the level of the write voltage or the power supply voltage of the nonvolatile memory device 100.

The write driver 140 may generate write voltages having the same levels, using the first voltage V1. Since the first voltage V1 is higher than the write voltage or the power supply voltage, the write driver 140 may generate a write voltage having a level close to the level of the power supply voltage.

Figure 5:
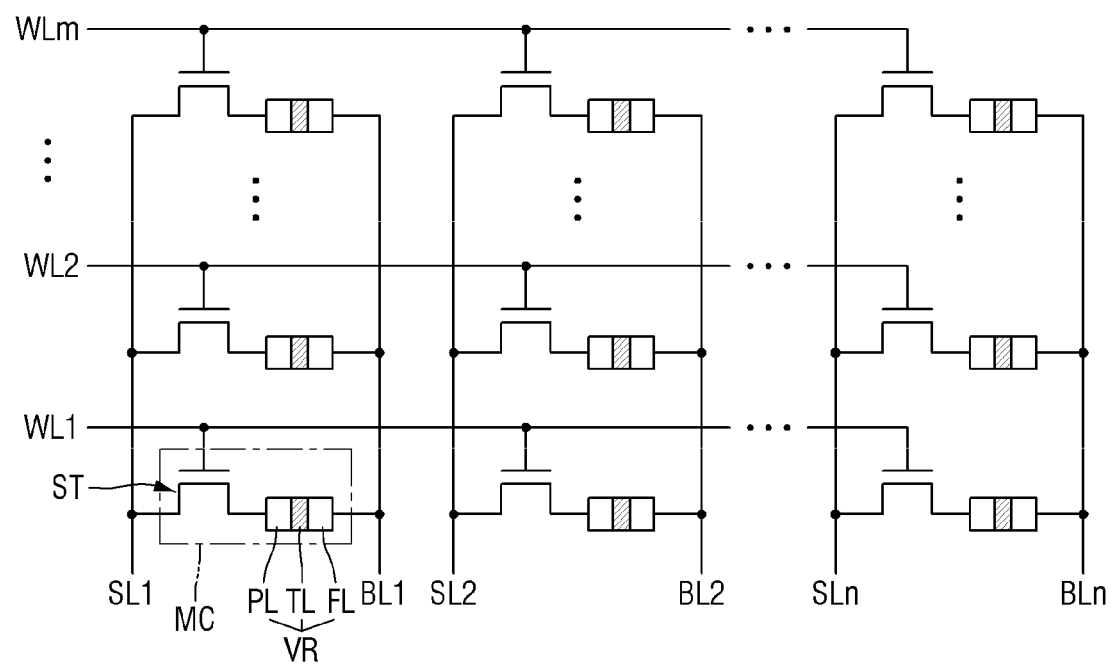
FIG. 5 is an exemplary circuit diagram for explaining a memory cell array.
Figure 6:
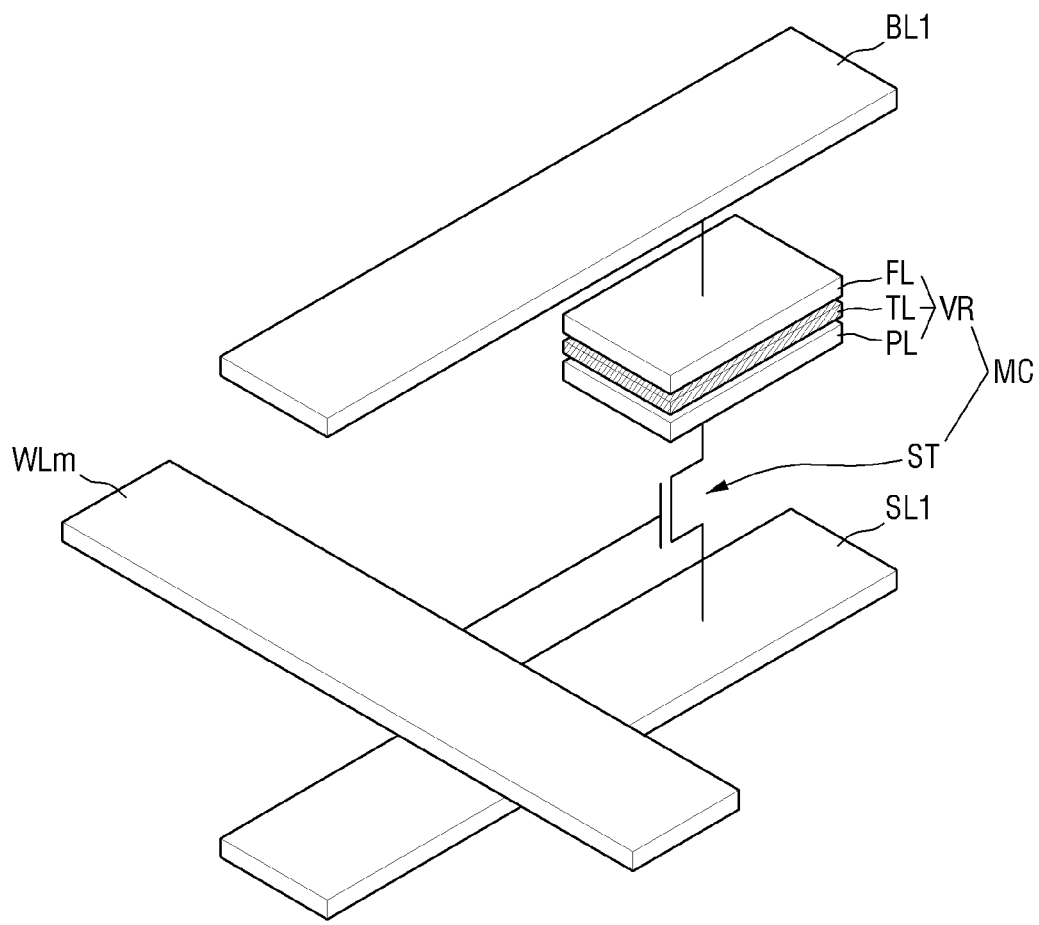
FIG. 6 is an exemplary perspective view for explaining the memory cell of a memory cell array.

FIG. 5 is an exemplary circuit diagram for explaining a memory cell array. FIG. 6 is an exemplary perspective view for explaining the memory cell of a memory cell array. Referring to FIGS. 1, 5 and 6, the memory cell array 110 includes a memory cell MC. The memory cell MC may be connected to source lines SL1 to SLn (n is a positive integer), bit lines BL1 to BLn, and word lines WL1 to WLm (m is a positive integer). The memory cells MC may be placed in rows and columns to thereby form a two-dimensional array of memory cells. The rows of the memory cells MC may be connected to each of the word lines WL1 to WLm. The rows of the memory cells MC may be connected to each of the source lines SL1 to SLn and the bit lines BL1 to BLn. The voltages of the word lines WL1 to WLm may be controlled through the row decoder 120 by the control of the control logic 160. The bit lines BL1 to BLn and the source lines SL1 to SLn may be connected to the column decoder 130.

One memory cell MC may include a selection transistor ST and a variable resistance element VR (that specifies a logic state of the MC). The selection transistor ST includes a first junction connected to each of the source lines SL1 to SLn, a second junction connected to each of the bit lines BL1 to BLn through the variable resistance element VR, and a gate connected to each of the word lines WL1 to WLm between the first junction and the second junction. For example, a gate of the selection transistor ST may be connected to the first word line WL1. One electrode of the selection transistor ST may be connected to the first bit line BL1 through the variable resistance element VR. Further, another electrode of the selection transistor ST may be connected to the first source line SL1.

The variable resistance element VR may include a pinned layer PL, a tunnel layer TL, and a free layer FL. The pinned layer PL may have a fixed magnetization direction. The free layer FL may have a magnetization direction that changes depending on the voltage (or current) applied to the variable resistance element VR. As will be understood by those skilled in the art, the resistance of the variable resistance element VR may change depending on whether the magnetization direction of the free layer FL is the same as (or how it is the same) or different from (or how it is different) the magnetization direction of the pinned layer PL. The variable resistance element VR may store data in the form of resistance magnitude.

Figure 7:
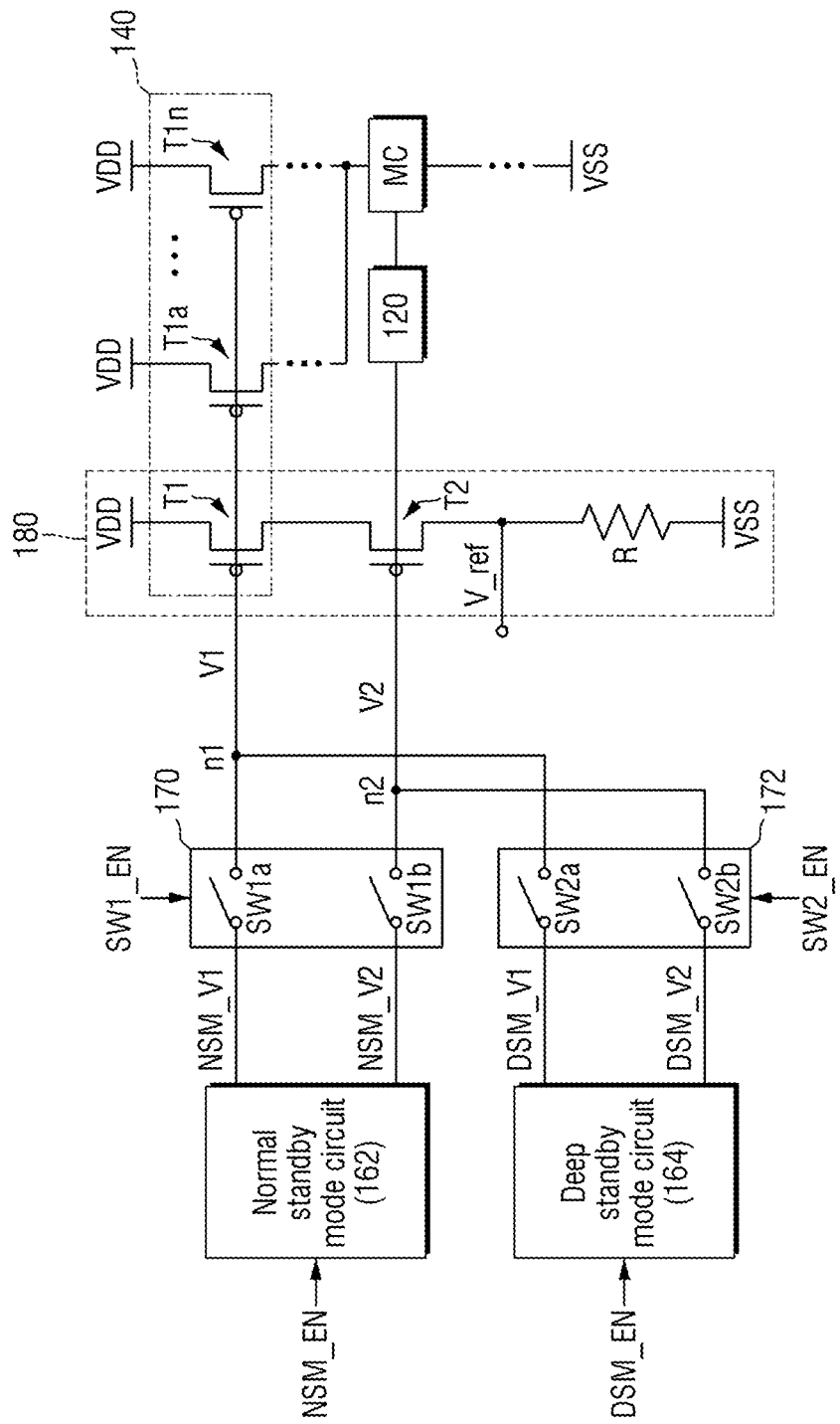
FIG. 7 is a diagram for explaining the operation of the nonvolatile memory device according to some embodiments.

FIG. 7 is a diagram for explaining the operation of the nonvolatile memory device according to some embodiments. Referring to FIGS. 1 and 7, the nonvolatile memory device 100 according to some embodiments may further include a first switch unit 170 and a second switch unit 172. The first switch unit 170 and/or the second switch unit 172 may be placed inside or outside the control logic 160, as described hereinabove with respect to FIGS. 1-2. The first switch unit 170 may be connected to the normal standby mode circuit 162. The first switch unit 170 may include a plurality of switches SW1a and SW1b. The first switch unit 170 may be controlled by a first switch enable signal SW1_EN. The first switch enable signal SW1_EN may be received from the control logic 160.

The second switch unit 172 may be connected to the deep standby mode circuit 164. The second switch unit 172 may include a plurality of switches SW2a and SW2b. The second switch unit 172 may be controlled by a second switch enable signal SW2_EN. The second switch enable signal SW2_EN may be received from the control logic 160.

The normal standby mode circuit 162 may be activated by a normal standby mode enable signal NSM_EN. The normal standby mode enable signal NSM_EN may be received from the control logic 160. The deep standby mode circuit 164 may be activated by a deep standby mode enable signal DSM_EN. The deep standby mode enable signal DSM_EN may be received from the control logic 160.

The first voltage NSM_V1 of the normal standby mode circuit 162 is transmitted to a switch SW1a, and the second voltage NSM_V2 may be transmitted to a switch SW1b. If the first switch unit 170 is activated by the first switch enable signal SW1_EN and the switches SW1a and SW1b are turned on, the first voltage NSM_V1 may be applied with a voltage V1 that gates the transistors T1 and T1a to T1n that form the write driver 140 through the first node n1. Further, if the first switch unit 170 is activated by the first switch enable signal SW1_EN and the switches SW1a and SW1b are turned on, the second voltage NSM_V2 may be applied with a voltage V2 that gates the transistor T2 connected to the row decoder 120 through the second node n2.

A first voltage DSM_V1 of the deep standby mode circuit 164 is transmitted to the switch SW2a, and a second voltage DSM_V2 may be transmitted to the switch SW2b. If the second switch unit 172 is activated by the second switch enable signal SW2_EN and the switches SW2a and SW2b are turned on, the first voltage DSM_V1 may be applied with the voltage V1 that gates the transistors T1 and T1a to T1n that form the write driver 140 through the first node n1. Further, if the second switch unit 172 is activated by the second switch enable signal SW2_EN and the switches SW2a and SW2b are turned on, the second voltage DSM_V2 may be applied with the voltage V2 that gates the transistor T2 connected to the row decoder 120 through the second node n2.

The transistor T1 may be connected to the power supply voltage VDD and the other end may be connected in series with the transistor T2. The resistor R connected in series with the transistors T1 and T2 may be connected to the ground voltage VSS. A reference voltage V_ref may be output through the node by which the transistor T2 and the resistor R are connected. The transistors T1 and T2 and the resistor R may form a reference voltage generation circuit unit 180.

Figure 8:
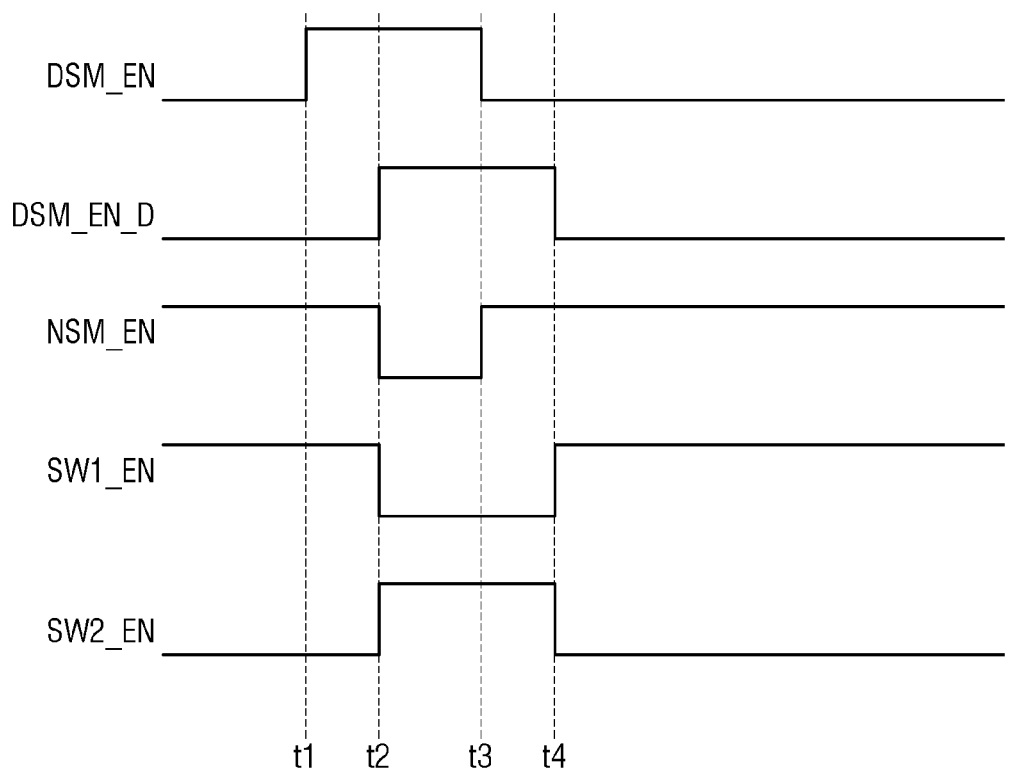
FIG. 8 is a timing diagram for explaining the operation of the nonvolatile memory device according to some embodiments.

FIG. 8 is a timing diagram for explaining the operation of the nonvolatile memory device according to some embodiments. Referring to FIGS. 7 and 8, the deep standby mode enable signal DSM_EN may be applied from a first time point t1 to a third time point t3. At this time, the deep standby mode enable signal DSM_EN is delayed during wake-up time, and a deep standby mode enable delay signal DSM_EN_D may be applied at a second time point t2 delayed by the wake-up time. That is, the deep standby mode enable delay signal DSM_EN_D is delayed during the wake-up time from a third time point t3 when the deep standby mode enable signal DSM_EN is turned off, and the deep standby mode enable delay signal DSM_EN_D may be turned off at a fourth time point t4 which is delayed by the wake-up time.

In contrast, the normal standby mode enable signal NSM_EN may be turned on during the wake-up time (e.g., during the time from the first time point t1 to the second time point t2 and during the time from the third time point t3 to the fourth time point t4). For example, the normal standby mode enable signal NSM_EN may be turned on until the second time point t2, turned off from the second time point t2 to the third time point t3, and turned on from the third time point t3 to the fourth time point t4. As shown, the second switch enable signal SW2_EN that activates the second switch unit 172 connected to the deep standby mode circuit 164 may be turned on from the second time point t2 to the fourth time point t4 when the deep standby mode enable delay signal DSM_EN_D is turned on. Thus, the first switch enable signal SW1_EN that activates the first switch unit 170 connected to the normal standby mode circuit 162 may be turned off, while the second switch enable signal SW2_EN is turned on. That is, the first switch enable signal SW1_EN may be turned off from the second time point t2 to the fourth time point t4.

Figure 9:
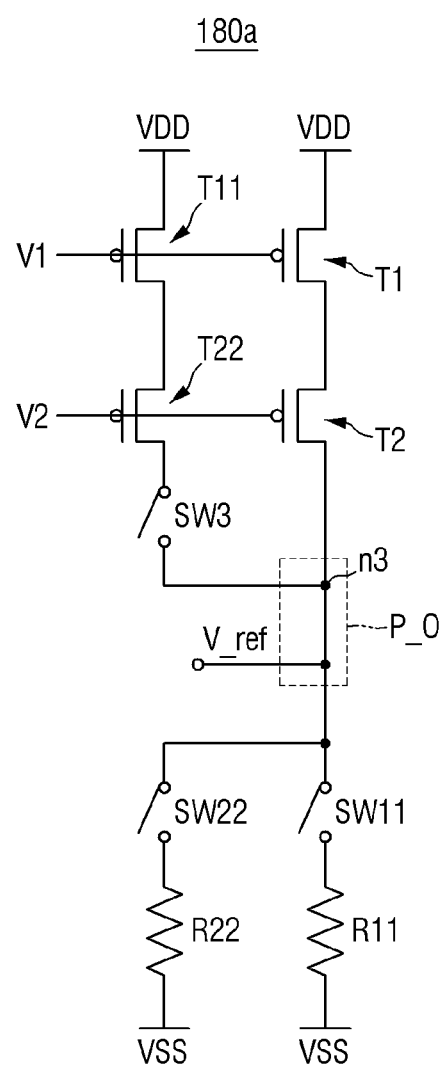
FIGS. 9 and 10 are circuit diagrams for explaining another exemplary embodiment of the reference voltage generation circuit unit 180 of FIG. 7.
Figure 10:
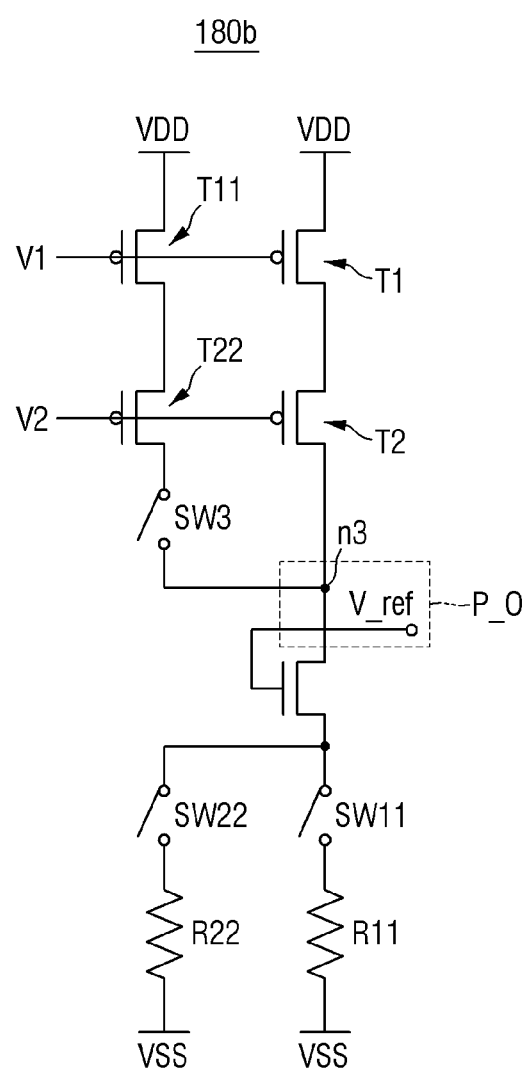

FIGS. 9 and 10 are circuit diagrams for explaining another exemplary embodiment of the reference voltage generation circuit unit 180 of FIG. 7. Referring to FIG. 9, a reference voltage generation circuit unit 180a includes transistors T11 and T22 connected in series with the power supply voltage VDD, and further includes transistors T1 and T2 connected in series with the power supply voltage VDD.

Transistors T1 and T11 may be gated by the first voltage V1. Further, transistors T2 and T22 may be gated by the second voltage V2. A transistor T1 and a transistor T11 may have an area ratio of N:1 (N is a natural number). Further, a transistor T2 and a transistor T22 may have an area ratio of N:1. The transistor T22 may be connected to a switch SW3. A switch SW22 and a resistor R22 connected in series may be connected to a third node n3 in which the reference voltage V_ref is generated. Further, a switch SW11 and a resistor R11 connected in series may be connected to the third node n3 in which the reference voltage V_ref is generated.

A ratio of the resistance magnitudes of the resistor R11 and the resistor R22 may be N+1:1. For example, when the nonvolatile memory device operates in the normal standby mode, the switches SW3 and SW22 may be open, and the switch SW11 may be closed. Further, when the nonvolatile memory device operates in the deep standby mode, the switch SW11 may be open, and the switches SW3 and SW22 may be closed.

That is, the reference voltage V_ref that is output through the third node n3 is the same in the normal standby mode and the deep standby mode. However, since the current flowing through the transistors T11 and T22 whose resistance decreases in the deep standby mode decreases, the leakage current can still be reduced.

Figure 11:
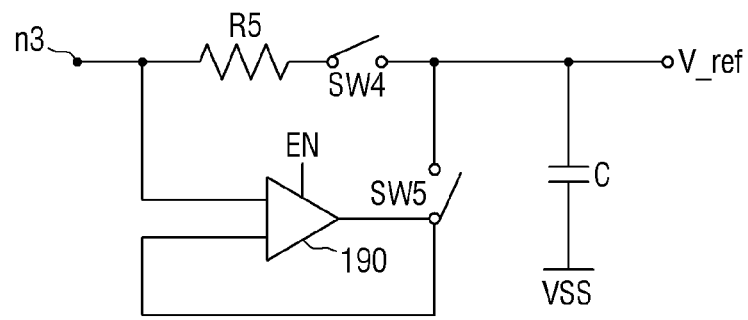
FIG. 11 is a circuit diagram for explaining another exemplary embodiment of the output terminal P_O of FIGS. 9 and 10.

Referring to FIG. 10, unlike FIG. 9, the transistor T33 may be connected to the third node n3 of the reference voltage generation circuit unit 180b. The transistor T33 has a structure in which a gate and a drain are connected. FIG. 11 is a circuit diagram for explaining another exemplary embodiment of the output terminal P_O of FIGS. 9 and 10.

Referring to FIG. 11, the output terminal P_Oa includes a resistor R5, and a switch SW4 connected in series with the resistor, between the third node n3 and the reference voltage V_ref generation node. Further, a buffer 190 may be included between the third node n3 and the reference voltage V_ref generation node. Further, a capacitor C may be connected to the reference voltage V_ref generation node.

The buffer 190 may be activated by the buffer enable signal EN. One end of the buffer 190 may be connected to the third node n3, and the other end of the buffer 190 may be connected to the output of the buffer 190. A switch SW5 may be connected between the output of the buffer 190 and the reference voltage V_ref generation node.

Figure 12:
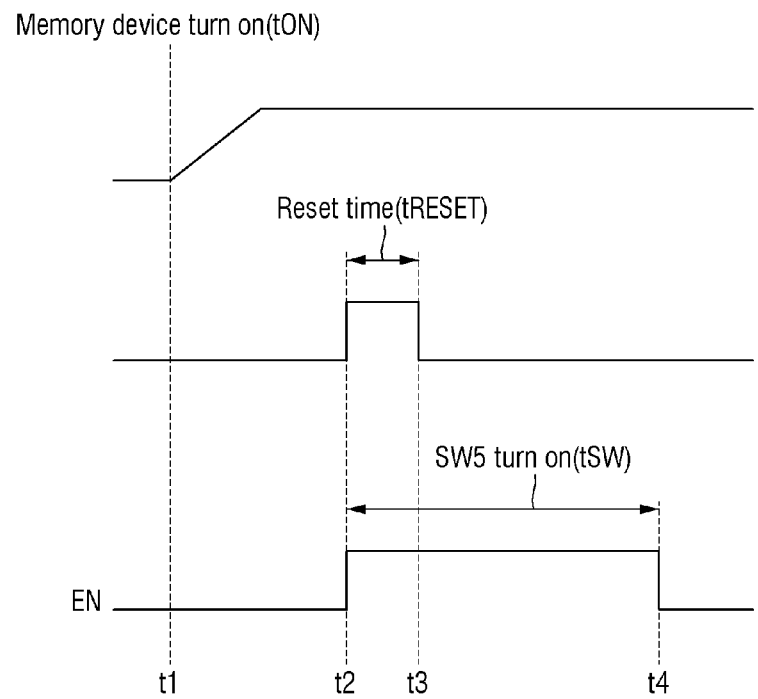
FIG. 12 is a timing diagram for explaining the operation of the output terminal.

The operation of the output terminal P_Oa is explained through FIG. 12. In particular, FIG. 12 is a timing diagram for explaining the operation of the output terminal. Referring to FIGS. 11 and 12, for example, the nonvolatile memory device is assumed to be turned on at the first time point t1 (tON). After that, the reset time after the normal standby mode or the deep standby mode is assumed to progress from the second time point t2 to the third time point t3 (tREST). At this time, the buffer enable signal EN that activates the buffer 190 may be activated from the second time point t2 at which the reset time starts to the fourth time point t4 at which the capacitor C is charged. The switch SW5 may also be turned on from the second time point t2 to the fourth time point t4 (tSW).

Figure 13:
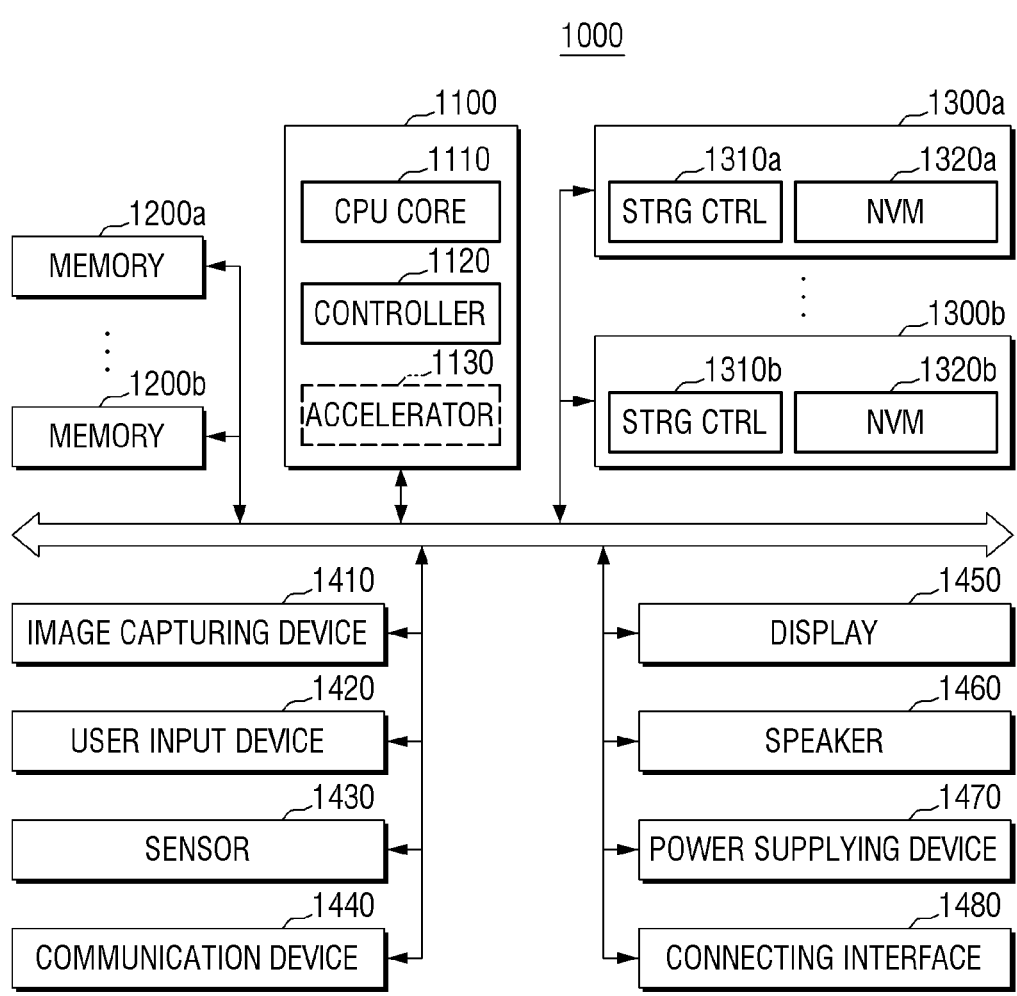
FIGS. 13 and 14 are block diagrams for explaining a storage system according to some embodiments.
Figure 14:
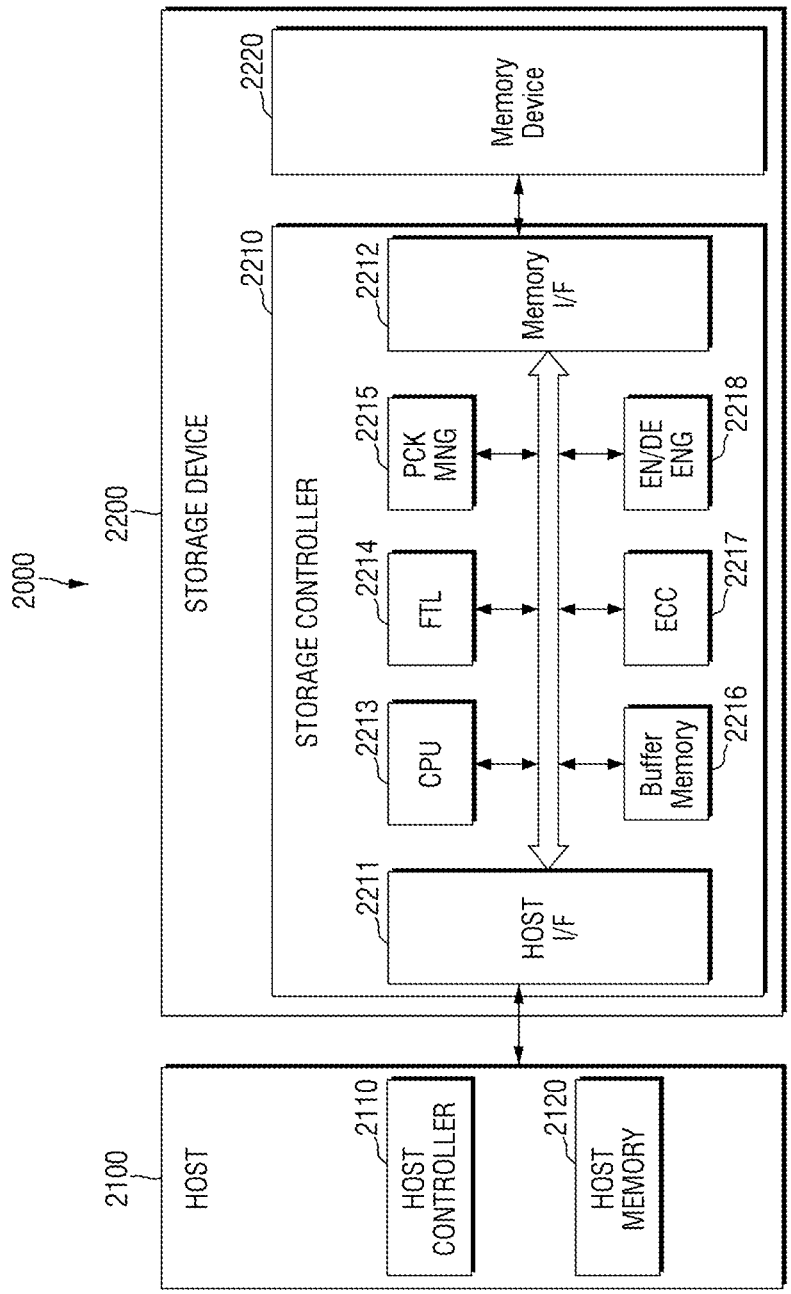

FIGS. 13 and 14 are block diagrams for explaining a storage system according to some embodiments. FIG. 13 is a diagram showing a system 1000 to which the nonvolatile memory device according to the embodiment of the present disclosure is applied. The system 1000 of FIG. 13 may be basically a mobile system such as a mobile phone terminal, a smart phone, a tablet PC (tablet personal computer), a wearable device, a healthcare device, or an Internet of Things (IOT) device. However, the system 1000 of FIG. 13 is not necessarily limited to the mobile system, but may be a personal computer, a laptop computer, a server, a media player, or an automotive device such as navigation.

Referring to FIG. 13, the system 1000 may include a main processor 1100, memories 1200a and 1200b, and storage devices 1300a and 1300b, and may additionally include one or more of an image capturing device 1410, a user input device 1420, a sensor 1430, a communication device 1440, a display 1450, a speaker 1460, a power supplying device 1470, and a connecting interface 1480.

The main processor 1100 may control the overall operations of the system 1000, more specifically, the operations of other components that form the system 1000. Such a main processor 1100 may be implemented as a general purpose processor, a dedicated processor, an application processor, or the like. In some embodiments, the main processor 1100 may include one or more CPU cores 1110, and may further include a controller 1120 for controlling the memories 1200a and 1200b and/or the storage devices 1300a and 1300b. Depending on the embodiments, the main processor 1100 may further include an accelerator 1130, which is a dedicated circuit for a high-speed data computation such as an AI (artificial intelligence) data computation. Such an accelerator 1130 may include a GPU (Graphics Processing Unit), an NPU (Neural Processing Unit) and/or a DPU (Data Processing Unit), and the like, and may be implemented as separate chips that are physically independent of other components of the main processor 1100.

The memories 1200a and 1200b may be used as a main memory unit of the system 1000, and may include a volatile memory such as an SRAM and/or a DRAM, but may also include a nonvolatile memory such as a flash memory, a PRAM and/or a RRAM. The memories 1200a and 1200b can also be implemented in the same package as the main processor 1100.

The storage devices 1300a and 1300b may function as nonvolatile storage devices that store data regardless of whether a power is supplied, and may have a relatively larger capacity than those of the memories 1200a and 1200b. The storage devices 1300a and 1300b may include storage controllers 1310a and 1310b, and nonvolatile memories (NVM) 1320a and 1320b that store data under the control of the storage controllers 1310a and 1310b.

The nonvolatile memories 1320a and 1320b may be nonvolatile memory devices explained above, for example, through FIGS. 1 to 12. The nonvolatile memories 1320a and 1320b may include a flash memory of a 2D (2-dimensional) structure or a 3D (3-dimensional) V-NAND (Vertical NAND) structure, but may also include other types of nonvolatile memory such as a PRAM, a MRAM and/or a RRAM.

The storage devices 1300a and 1300b may be included in the system 1000 in a state of being physically separated from the main processor 1100, and may be implemented inside the same package as the main processor 1100. Further, since the storage devices 1300a and 1300b have a shape such as an SSD (solid state device) or a memory card, the storage devices 1300a and 1300b may also be detachably coupled with other constituent elements of the system 1000 through an interface such as a connecting interface 1480 to be described below. Such storage devices 1300a and 1300b may be, but are not necessarily limited to, devices to which standard protocols such as a UFS (universal flash storage), an eMMC (embedded multi-media card) or an NVMe (nonvolatile memory express) are applied.

The image capturing device 1410 may capture still images or moving images, and may be a camera, a camcorder, and/or a webcam and the like. The user input device 1420 may receive various types of data that are input from users of the system 1000, and may be a touch pad, a key pad, a key board, a mouse and/or a microphone.

The sensor 1430 may detect various different physical quantities that may be acquired from the outside of the system 1000, and convert the detected physical quantities into electrical signals. Such a sensor 1430 may be a temperature sensor, a pressure sensor, an illuminance sensor, a position sensor, an acceleration sensor, a biosensor and/or a gyroscope sensor.

The communication device 1440 may transmit and receive signals to and from other devices outside the system 1000 according to various communication protocols. Such a communication device 1440 may be implemented to include an antenna, a transceiver and/or a modem and the like.

The display 1450 and the speaker 1460 may each function as output devices that output visual and auditory information to the user of the system 1000. In addition, the power supplying device 1470 may appropriately convert the power supplied from a battery (not shown) equipped in the system 1000 and/or an external power supply and supply the power to each constituent element of the system 1000.

The connecting interface 1480 may provide a connection between the system 1000 and an external device that may be connected to the system 1000 to transmit and receive data to and from the system 1000. The connecting interface 1480 may be implemented by various interface types, such as an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe, an IEEE 1394, a USB (universal serial bus), an SD (secure digital) card, a MMC (multi-media card), an eMMC, a UFS, an eUFS (embedded Universal Flash Storage), and a CF (compact flash) card interface.

Referring to FIG. 14. a host-storage system 2000 may include a host 2100 and a storage device 2200. Further, the storage device 2200 may include a storage controller 2210 and a nonvolatile memory (NVM) 2220. Further, according to exemplary embodiments of the present disclosure, the host 2100 may include a host controller 2110 and a host memory 2120. The host memory 2120 may function as a buffer memory for temporarily storing data to be transmitted to the storage device 2200 or data transmitted from the storage device 2200.

The storage device 2200 may include storage medium for storing data in response to a request from the host 2100. As an example, the storage device 2200 may include at least one of an SSD (Solid status Drive), an embedded memory, and an attachable and detachable external memory. When the storage device 2200 is the SSD, the storage device 2200 may be, for example, a device that complies with a non-volatility memory express (NVMe) standard. When the storage device 2200 is an embedded memory or an external memory, the storage device 2200 may be a device that complies with a UFS (universal flash storage) or an eMMC (embedded multi-media card) standard. The host 2100 and the storage device 2200 may each generate and transmit packets according to the adopted standard protocol.

When the nonvolatile memory 2220 of the storage device 2200 includes a flash memory, such a flash memory may include a 2D NAND memory array or a 3D (or vertical) NAND (VNAND) memory array. As another example, the storage device 2200 may include different various types of nonvolatile memories. For example, the storage device 2200 may include a MRAM (Magnetic RAM), a spin-transmit torque MRAM, a conductive bridging RAM (CBRAM), a FeRAM (Ferroelectric RAM), a PRAM (Phase RAM), a resistive memory (Resistive RAM), and various other types of memories.

The nonvolatile memory 2220 may be the nonvolatile memory device explained above through FIGS. 1 to 12. According to an embodiment, the host controller 2110 and the host memory 2120 may be implemented as separate semiconductor chips. Further, in some embodiments, the host controller 2110 and the host memory 2120 may be integrated on the same semiconductor chip. As an example, the host controller 2110 may be any one of a plurality of modules provided in the application processor, and the application processor may be implemented as a system on chip (SoC). Further, the host memory 2120 may be an embedded memory provided inside the application processor, or a nonvolatile memory or a memory module placed outside the application processor.

The host controller 2110 may manage an operation of storing the data (for example, write data) of a buffer region of the host memory 2120 in the nonvolatile memory 2220 or storing the data (for example, read data) of the nonvolatile memory 2220 in the buffer region.

The storage controller 2210 may include a host interface 2211, a memory interface 2212, and a CPU (central processing unit) 2213. Also, the storage controller 2210 may further include a flash translation layer (FTL) 2214, a packet manager 2215, a buffer memory 2216, an ECC (error correction code, 2217) engine, and an encryption/decryption engine 2218. The storage controller 2210 may further include a working memory (not shown) into which the flash translation layer (FTL) 2214 is loaded, and when the CPU 2213 executes the flash translation layer, the data write and read operations on the nonvolatile memory may be controlled.

The host interface 2211 may transmit and receive packets to and from the host 2100. The packets transmitted from the host 2100 to the host interface 2211 may include a command, data to be written in the nonvolatile memory 2220, or the like. The packets transmitted from the host interface 2211 to the host 2100 may include a response to the command, data that is read from the nonvolatile memory 2220 or the like. The memory interface 2212 may transmit the data to be written in the nonvolatile memory 2220 to the nonvolatile memory 2220 or receive the data that is read from the nonvolatile memory 2220. Such a memory interface 2212 may be implemented to comply with standard protocols such as Toggle or ONFI (Open NAND Flash Interface).

The flash translation layer 2214 may perform various functions such as address mapping, wear-leveling, and garbage collection. The address mapping operation is an operation of changing a logical address received from the host 2100 into a physical address which is used for actually storing the data in the nonvolatile memory 2220. The wear-leveling is a technique for ensuring that blocks in the nonvolatile memory 2220 are used uniformly to prevent an excessive degradation of a particular block, and may be implemented, for example, through a firmware technique for balancing the erasure counts of the physical blocks. The garbage collection is a technique for ensuring an available capacity in the nonvolatile memory 2220 through a method of copying the valid data of the block to a new block and then erasing the existing block.

The packet manager 2215 may generate a packet according to the protocol of the interface discussed with the host 2100, or may parse various types of information from the packet received from the host 2100. Further, the buffer memory 2216 may temporarily store the data to be written in the nonvolatile memory 2220 or the data to be read from the nonvolatile memory 2220. The buffer memory 2216 may be configured to be provided inside the storage controller 2210, but may be placed outside the storage controller 2210.

An ECC engine 2217 may perform error detection and correction functions on the read data that is read from the nonvolatile memory 2220. More specifically, the ECC engine 2217 may generate parity bits for the write data to be written on the nonvolatile memory 2220, and the parity bits thus generated may be stored in the nonvolatile memory 2220 together with the write data. When reading the data from the nonvolatile memory 2220, the ECC engine 2217 may correct an error of the read data, using the parity bits that are read from the nonvolatile memory 2220, together with the read data, and may output the read data with a corrected error.

The encryption/decryption engine 2218 may perform at least one operation of the encryption operation and the decryption operation on the data that is input to the storage controller 2210.

For example, the encryption/decryption engine 2218 may perform the encryption operation and/or the decryption operation using a symmetric-key algorithm. At this time, the encryption/decryption engine 2218 may perform encryption and/or decryption operations using, for example, an AES (Advanced Encryption Standard) algorithm or a DES (Data Encryption Standard) algorithm.

Further, for example, the encryption/decryption engine 2218 may perform the encryption operation and/or the decryption operation, using a public key encryption algorithm. At this time, for example, the encryption/decryption engine 2218 may perform the encryption using the public key at the time of the encryption operation, and may perform the decryption using the private key at the time of the decryption operation. For example, the encryption/decryption engine 2218 may use RSA (Rivest Shamir Adleman), ECC (Elliptic Curve Cryptography) or DH (Diffie-Hellman) encryption algorithm.

The encryption/decryption engine 2218 may perform the encryption operation and/or the decryption operation, using quantum cryptography such as HO (Homomorphic Encryption), PQC (Post-Quantum Cryptography) or FE (Functional Encryption), without being limited thereto.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A nonvolatile memory device, comprising:
   a memory cell array having nonvolatile memory cells therein, which are electrically connected to a plurality of word lines and a plurality of bit lines;
   a write driver electrically connected to the plurality of bit lines;
   a row decoder electrically connected to the plurality of word lines; and
   control logic configured to transfer a first voltage to the write driver and a second voltage to the row decoder, said control logic including: (i) a normal standby mode circuit configured to operate in a normal standby mode, and (ii) a deep standby mode circuit configured to operate in a deep standby mode; and
   wherein layout areas of a plurality of elements within the deep standby mode circuit are smaller than layout areas of elements within the normal standby mode circuit, so that current flowing within the deep standby mode circuit during the deep standby mode is less than current flowing within the normal standby mode circuit during the normal standby mode.

2. The device of claim 1, wherein the layout areas of the plurality of elements within the deep standby mode circuit are less than one-half the layout areas of the plurality of elements within the normal standby mode circuit.

3. The device of claim 2, wherein the current flowing within the deep standby mode circuit during the deep standby mode is less than one-half the current flowing within the normal standby mode circuit during the normal standby mode.

4. The device of claim 1, wherein the normal standby mode circuit includes a first sensing circuit and a first operational amplifier circuit; wherein the deep standby mode circuit includes a second sensing circuit and a second operational amplifier circuit; wherein the first and second sensing circuits have equivalent circuit structure; wherein the first and second operational amplifier circuits having equivalent circuit structure; wherein layout areas of a plurality of elements within the first sensing circuit are greater than layout areas of a plurality of elements within the second sensing circuit; and wherein layout areas of a plurality of elements within the first operational amplifier circuit are greater than layout areas of a plurality of elements within the second operational amplifier circuit.

5. The device of claim 4, wherein only the first sensing circuit within the normal standby mode circuit is operational during the normal standby mode; and wherein only the second operational amplifier circuit is operational during the deep standby mode.

6. The device of claim 1, further comprising:
a first switch unit electrically connected to the normal standby mode circuit; and
a second switch unit electrically connected to the deep standby mode circuit; and
wherein an output of the first switch unit and an output of the second switch unit are electrically connected together.

7. The device of claim 6, wherein the first switch unit is turned on and the second switch unit is turned off during the normal standby mode; and wherein the first switch unit is turned off and the second switch unit is turned on during the deep standby mode.

8. A nonvolatile memory device, comprising:
a normal standby mode circuit, which is configured to be activated in response to a normal standby mode enable signal; and
a deep standby mode circuit, which is configured to be active in response to a deep standby mode enable signal;
wherein layout areas of a plurality of elements within the deep standby mode circuit are smaller than areas of corresponding elements within the normal standby mode circuit;
wherein current flowing within the deep standby mode circuit is less than current flowing within the normal standby mode circuit;
when the deep standby mode enable signal is activated at a first time point, and the deep standby mode circuit is activated at a second time point delayed relative to the first time point; and
wherein the normal standby mode enable signal maintains a turned-on status from the first time point to the second time point.

9. The device of claim 8, wherein when the deep standby mode enable signal is deactivated at a third time point, and the deep standby mode circuit is deactivated at a fourth time point delayed relative to the third time point; and wherein the normal standby mode enable signal maintains a turned-on status from the third time point to the fourth time point.

10. The device of claim 8, further comprising:
a first switch unit electrically connected to the normal standby mode circuit and activated by a first switch enable signal; and
a second switch unit electrically connected to the deep standby mode circuit and activated by a second switch enable signal; and
wherein an output of the first switch unit and an output of the second switch unit are electrically connected together.

11. The device of claim 10, wherein the first switch unit is turned on and the second switch unit is turned off during the normal standby mode; and wherein the first switch unit is turned off and the second switch unit is turned on during the deep standby mode.

12. The device of claim 11, wherein the first switch enable signal is activated from the first time point to the second time point.

13. The device of claim 8, wherein layout areas of a plurality of elements within the deep standby mode circuit are less than one-half the layout areas of corresponding elements within the normal standby mode circuit.

14. The device of claim 13, wherein the current flowing within the deep standby mode circuit during the deep standby mode is less than one-half the current flowing within the normal standby mode circuit during the normal standby mode.

15. The device of claim 8, wherein the normal standby mode circuit includes a first sensing circuit and a first operational amplifier circuit; wherein the deep standby mode circuit includes a second sensing circuit and a second operational amplifier circuit; wherein the first sensing circuit and the second sensing circuit have the same circuit structure; wherein the first operational amplifier circuit and the second operational amplifier circuit have the same circuit structure; wherein layout areas of a plurality of elements within the first sensing circuit are greater than layout areas of a plurality of elements within the second sensing circuit; and wherein layout areas of a plurality of elements within the first operational amplifier circuit are greater than layout areas of a plurality of elements within the second operational amplifier circuit.

16. The device of claim 15, wherein only the first sensing circuit within the normal standby mode circuit operates during the normal standby mode; and wherein only the second operational amplifier circuit within the deep standby mode circuit operates during the deep standby mode.

17. A nonvolatile memory device, comprising:
a memory cell having a first terminal connected to a bit line and a second terminal connected to a word line;
a first transistor within a write driver, which is electrically connected to the bit line and configured to transmit a first voltage;
a second transistor, which is configured to transmit a second voltage to a row decoder connected to the word line and is electrically connected in series with the first transistor;
a first resistor electrically connected in series with the first transistor and the second transistor; and
a normal standby mode circuit and a deep standby mode circuit, which control the first voltage and the second voltage;
wherein the normal standby mode circuit operates during a normal standby mode;
wherein the deep standby mode circuit operates during a deep standby mode;
wherein layout areas of a plurality of elements within the deep standby mode circuit are smaller than layout areas of elements within the normal standby mode circuit; and
wherein a current flowing within the deep standby mode circuit during the deep standby mode is less than a current flowing within the normal standby mode circuit during the normal standby mode.

18. The device of claim 17, further comprising:
a third transistor having a gate terminal responsive to the first voltage;
a fourth transistor having a gate terminal responsive to the second voltage; and
a first switch electrically connected to the fourth transistor;
wherein the third transistor and the fourth transistor are electrically connected in series; and
wherein when the current flows through the first transistor and the second transistor, the first switch is turned off, but when no current flows through the first transistor and the second transistor, the first switch is turned on.

19. The device of claim 18, further comprising:
a second switch and a third switch electrically connected to the second transistor;
a second resistor electrically connected in series with the second switch; and
a third resistor electrically connected in series with the third switch,
wherein the second resistor is greater than the third resistor; and
wherein layout areas of the third transistor and the fourth transistor are greater than layout areas of the first transistor and the second transistor.

20. The device of claim 19, wherein when the second switch is turned on, the third switch is turned off, and when the third switch is turned on, the second switch is turned off.

* * * * *